United States Patent [19]
Baumgartner et al.

[11] Patent Number: 5,769,384
[45] Date of Patent: Jun. 23, 1998

[54] LOW DIFFERENTIAL LIGHT LEVEL PHOTORECEPTORS

[75] Inventors: Richard A. Baumgartner, Palo Alto; Travis N. Blalock, Santa Clara; Thomas Hornak, Portola Valley; Joey Doernberg, San Carlos, all of Calif.

[73] Assignee: Hewlett-Packard Company, Palo Alto, Calif.

[21] Appl. No.: 591,848

[22] Filed: Jan. 25, 1996

[51] Int. Cl.$^6$ .................................................. H03F 1/34
[52] U.S. Cl. .................................... 250/214 A; 330/293
[58] Field of Search ........................ 250/214 R, 214.1, 250/214 A, 208.1, 214 AG; 330/250, 269, 270, 271, 273, 277, 282, 288, 290, 291, 293, 296, 300, 308

[56] References Cited

U.S. PATENT DOCUMENTS

| | | | |
|---|---|---|---|
| 4,173,723 | 11/1979 | Temes et al. | 250/214 R |
| 4,574,249 | 3/1986 | Williams | 250/214 AG |
| 5,149,980 | 9/1992 | Ertel et al. | 250/561 |
| 5,198,660 | 3/1993 | Yokoyama | 250/214 A |
| 5,256,986 | 10/1993 | Flocke et al. | 330/293 |
| 5,296,696 | 3/1994 | Uno | 250/208.1 |

*Primary Examiner*—Edward P. Westin
*Assistant Examiner*—John R. Lee

[57] ABSTRACT

Circuitry and circuitry layout are provided to achieve a high percentage of photoreceiver area to total area and to stabilize the voltage at the base node of a phototransistor. Voltage stabilization is achieved by a servo circuit in which a negative feedback loop from the base node to an emitter node maintains a bias point, so that photocurrent is efficiently delivered to charge transfer circuitry. In the preferred embodiment, the base node is connected to a gate of a first transistor having a drain that is connected to a source of constant current and to a gate of a second transistor that functions as a source follower. The source of the second transistor is connected to the emitter node of a phototransistor. As photocurrent is generated by the reception of light, an integration capacitor is charged. The relatively high percentage of photoreceiver area to total area is achieved by contributions from a number of factors, including the design of the servo circuit, use of a single transfer amplifier to service an entire row of phototransistors, and pairing the phototransistor circuits in order to permit efficient sharing of common circuit paths and circuit components.

12 Claims, 6 Drawing Sheets

LOW DIFFERENTIAL LIGHT LEVEL PHOTORECEPTORS

TECHNICAL FIELD

The present invention relates generally to photoreceptors designed to operate at low light levels and more particularly to circuits for increasing the reliability of photoreceiver information acquired under conditions in which a signal-to-noise ratio is relatively small.

BACKGROUND ART

An accurate determination of the path of a device across a surface is important in a variety of applications. For example, if a faithful representation of an image of a scanned original is to be acquired, there must be accurate information as to the travel of the scanning device along the original. Typically, the captured image provided by a scanner is a pixel data array that is stored in memory in a digital format. A distortion-free image requires a faithful mapping of the original image to the pixel data array.

U.S. Pat. No. 5,149,980 to Ertel et al., which is assigned to the assignee of the present invention, describes use of a cross-correlation function to determine the relative movement between an original and an array of photoelements in a given direction. The patent notes that the one-dimensional approach can be extended to determine the vector of two-dimensional relative movement between the original and the array, so as to track translation, rotation and scaling in a two-dimensional plane.

The patent to Ertel et al. describes use of an optical sensor array to collect a "signature" of an original. The signature may be provided by illuminating and imaging the surface texture or other optical characteristics of the original. The light intensity will vary on a pixel-by-pixel basis with variations in surface texture. By cross-correlating images of the surface of the original, relative movement between the array and the original can be ascertained.

A critical element of the design of a system such as the one described by Ertel et al. is circuitry to maintain the signal-to-noise ratio of each photoelement sufficiently high to reliably determine the signature of the original. If the signal is the difference in reflectivity from pixel to pixel as a result of slight variations in paper texture of a white paper, the variation in reflectivity may only be approximately six percent. The overall resolution goals translate into a relatively low signal-to-noise ratio for each photoelement, with the desired signal being the small change in reflectivity of the medium of interest and the dominant noise term being shot noise of the photodiode as a result of the fixed portion of the reflectivity. The noise signal must be less than the six percent paper reflectivity variation signal if useful information is to be obtained.

What is needed is circuitry which permits reliable use of a photoelement signal in applications in which small light-intensity differentials are employed as application information.

SUMMARY OF THE INVENTION

Circuitry is employed to provide a two-step improvement to acquiring a sufficient signal-to-noise ratio in photoelement applications requiring small light intensity differentiation. Firstly, the circuitry provides a high percentage of photoreceiver area to total area and, secondly, the circuitry is designed to increase the portion of the signal that is transferred to computational circuitry.

A servo circuit is used to bias a base node via an emitter node of a phototransistor. The base node is thereby maintained at a substantially fixed voltage, so that photocurrent generated by reception of light energy is directed to a pixel storage capacitor, rather than being used to charge and discharge parasitic capacitance of the phototransistor. The use of the phototransistor provides current gain for a photodiode output. Consequently, the photoelement is better suited for operation at low light levels and operation in applications in which small light-intensity differentials define the data to be processed.

The servo circuit is a negative feedback loop in which a voltage variation at the base node of the phototransistor is translated to an inverse voltage variation at the emitter node. In the preferred embodiment, the base node is connected to a gate of a first transistor. A drain of the first transistor is connected to a source of a constant current, such as a transistor that establishes a high impedance. The drain of the transistor is also connected to a gate of a second transistor that functions as a source follower for this operation. The source of the second transistor is connected to the emitter node of the phototransistor, while the drain is selectively connected to a fixed voltage source via a reset switch. While not critical, the reset switch may be a p-channel transistor.

An integration capacitor may be connected from the collector of the phototransistor to the drain of the second transistor. As photocurrent is generated by the reception of light, the integration capacitor is charged. The integration capacitor is selectively connected to a read line for output by a transfer amplifier. In the preferred embodiment, the transfer amplifier is sequentially connected to integration capacitors of a column of photoelements, so that a single transfer amplifier services an entire column of photoelements.

The presence of the servo circuit ensures efficient charging of the integration capacitor of a particular photoelement. The first transistor monitors the voltage at the base node of the phototransistor. If the voltage at the base node is induced to increase, the increase is applied to the gate of the second transistor, which acts as a source follower to apply the charge to the emitter node. Since there is no DC load constraint on the base of the phototransistor, the effect is passed onto the base node.

The relatively high percentage of photoreceiver area to total area is achieved by contributions from a number of factors. One contributing factor is the design of the servo circuit to stabilize the base voltage using a relatively small number of components. Another contributing factor is the use of one transfer amplifier to service an entire column of photoelements. Another contributing factor is the formation of photoelement pairs to permit efficient sharing of common circuit paths, such as the read line to the transfer amplifier. Each photoelement pair includes separate photoreceptive areas and includes operation circuitry between the photoreceptive areas. The difference in output between neighboring photoelements is the signal of interest. Therefore, the switching devices for reading individual integration capacitors may be operated without charge-injection compensation circuitry, since the injection effects from one photoelement will match the neighboring photoelements and subtract out from the difference signal.

An advantage of the invention is that the servo circuit of a photoelement maintains the bias point on the phototransistor base, so that the light-induced current is efficiently delivered to the appropriate integration capacitor. Another advantage is that a high percentage of photoreception area is achieved. A substrate PNP transistor is used to enhance the current levels from a photodiode, so that the integration capacitor may be sufficiently large to be reproducible from photoelement to photoelement.

BEST MODE FOR CARRYING OUT THE INVENTION

Figure 1:
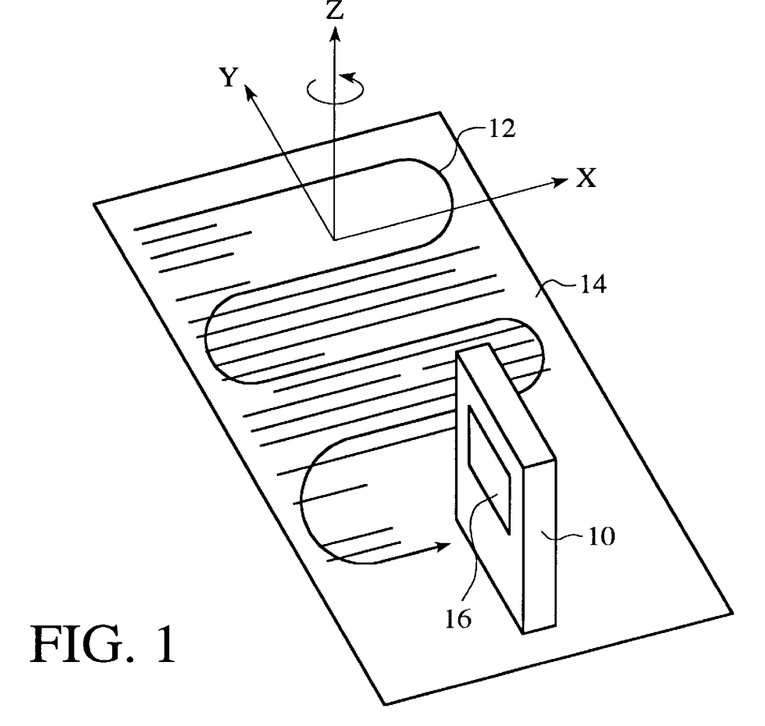
FIG. 1 is a perspective view of a hand-held scanning device following a meandering path on an original.

With reference to FIG. 1, a portable, hand-held scanning device 10 is shown as having followed a meandering path 12 along an original 14. The original may be a piece of paper, but the invention may be used with other imaging-bearing substrates. In use of the hand-held scanning device, the positions of inherent structural features, such as paper fibers, may be tracked and the resulting positional information may be used to rectify image data. However, the invention may be used in other applications.

The scanning device 10 is preferably self-contained and battery operated. However, the device may include a connection to an external source of power or to data ports of computers or networks. The scanning device includes an image display 16. The display may provide almost immediate viewing of a captured image. The display is not critical.

The scanning device 10 allows three degrees of freedom, with two being in translation and one in rotation. The first degree is the side-to-side movement (X axis movement) along the original 14. The second degree of freedom is movement upwardly and downwardly along the original (Y axis movement). The third degree of freedom is the ability to operate the device with rotational misalignment of a linear array of image sensor elements relative to the edge of the original 14 (η axis movement). That is, the linear array of imaging elements may have an angle of attack that is not perpendicular to the direction of device translation.

Figure 2:
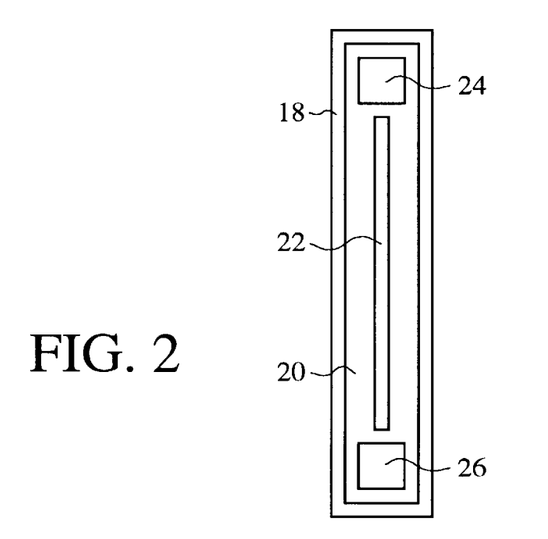
FIG. 2 is a bottom view of imaging and navigation sensors of the scanning device of FIG. 1.

Referring now to FIGS. 1 and 2, the bottom side 18 of the scanning device 10 includes a pivoting member 20 that aids in maintaining proper contact between the original 14 and an imaging sensor 22. Navigation sensors 24 and 26 are located at the opposed ends of the imaging sensor. Because the navigation sensors are mounted on the pivoting member, the navigation sensors are in a fixed location relative to the imaging sensor.

For reasons of physical compactness, the imaging sensor 22 is preferably a contact image device, but for applications in which compactness is less of a concern or a smaller image is desired, sensors employing projection optics may be employed, with magnification less than unity. Contact imaging devices typically employ lenses sold under the trademark SELFOC, which is a federally-registered mark of Nippon Sheet Glass Company Limited. Less conventionally, contact imaging can be obtained using interleaved array elements of sources and proximal sensors, without any imaging lenses. Conventional imaging sensors for scanning applications may be used. The imaging sensor may be part of a unit that also includes an illumination source, illumination optics, and image transfer optics.

In FIG. 1, the meandering path 12 is shown as having four and a fraction swaths, i.e., side-to-side passes across the original 14. A useful imaging sensor 22 for most applications has a length within the range of 25 mm and 100 mm. The swaths should include regions of overlap, so that a stitching process may be used to produce a faithful representation of the scanned original.

The scanning device 10 includes at least one navigation sensor 24 or 26. In the preferred embodiment, the device includes a pair of navigation sensors, with the sensors being at opposite ends of the imaging sensor 22. While one-dimensional arrays of photoelements that are mounted orthogonally to each other may be used, the much preferred embodiment is one in which each navigation sensor is a two-dimensional array of elements. The navigation sensors 24 and 26 are used to track movement of the scanning device 10 relative to the original.

Each navigation sensor is an array of photoelements that is formed on an integrated circuit substrate that includes readout and signal processing circuitry. The position accuracy necessary over the range of a pixel distance of 40 μm is 2.0 μm. The very high positional accuracy requires individual photoelements that are no larger than tens of microns in length in order to acquire sufficiently differing signals from element to element. In the preferred embodiment, the pixel size desired on the paper original 14 is 40 microns and a magnification of 1.5 is achieved by the imaging optics, so that the photoreceptor elements of the navigation sensors 24 and 26 are 60 μm×60 μm. Each navigation sensor may be an array having sixty-four columns and thirty-two rows. However, none of these numbers is critical to the invention.

In the operation of the navigation sensors 24 and 26, the desired signal is the difference in reflectivity from pixel to pixel, as caused by variations along the surface of the original 14. Where surface variations are variations in paper texture along a white paper, the reflectivity may vary by only approximately six percent of the basic reflectivity of the white paper. The overall resolution goals would then translate into a signal-to-noise ratio of approximately two for each photoelement. The dominant noise term is the shot noise of the photoelement signal caused by the fixed portion of the reflectivity. The noise signal needs to be less than the six percent paper reflectivity variation if the navigation is going to be determined. The present invention addresses the problem by providing a servo circuit to stabilize the voltage level at a base node of each photoelement and by establishing a high percentage of photoreceptor area to total area of a navigation sensor 24 and 26.

Figure 3:
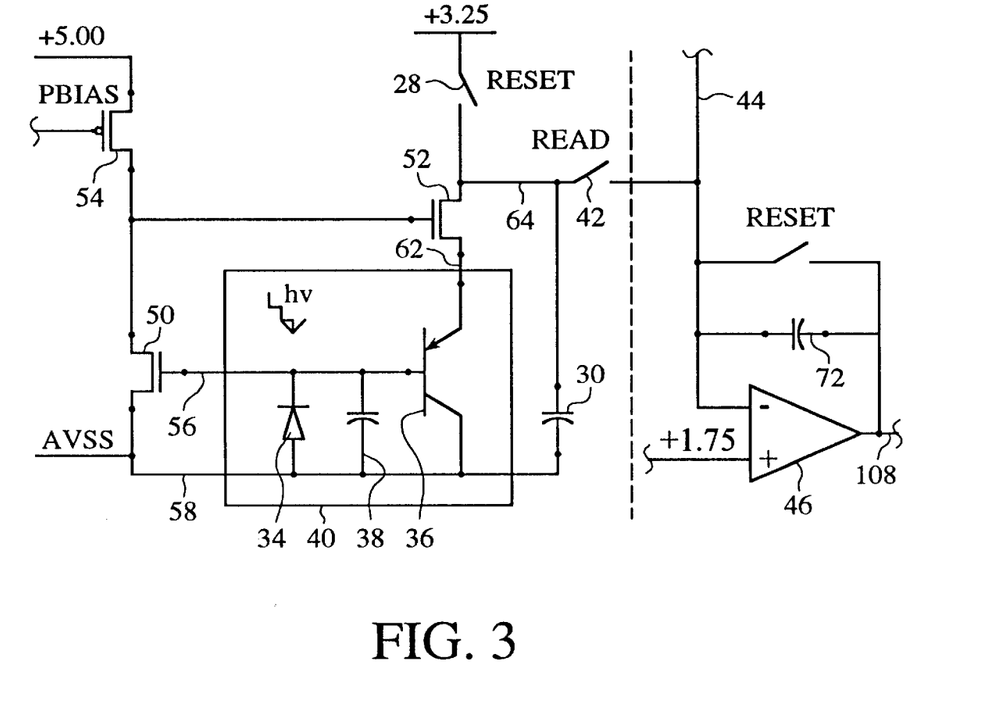
FIG. 3 is a photoelement circuit having a negative feedback loop in accordance with the invention.
Figure 4:
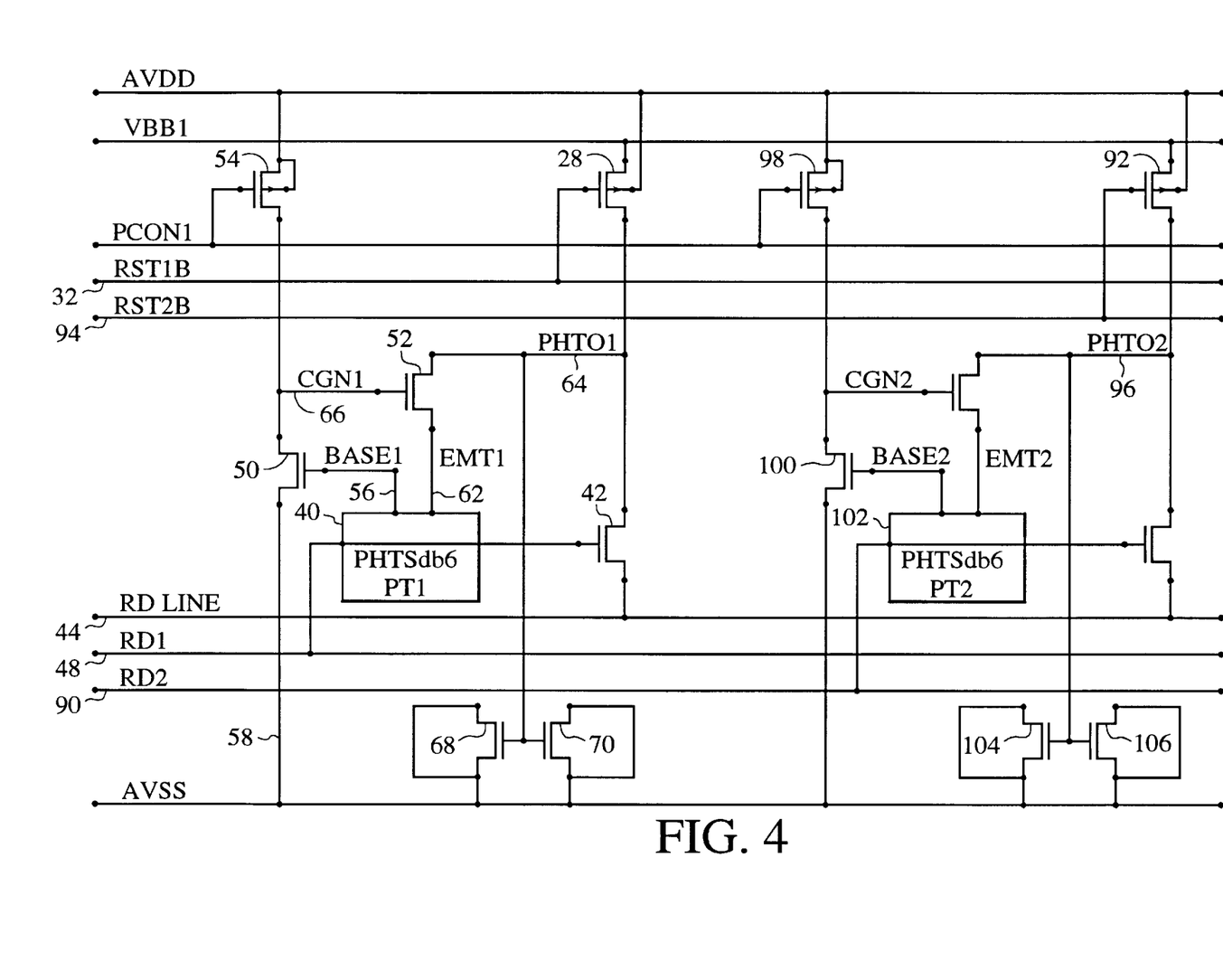
FIG. 4 is a schematic diagram of a photoelement pair in accordance with the invention.

FIG. 3 is a schematic diagram of a photoelement circuit. FIG. 4 is a more detailed circuit diagram of a photoelement pair. Incoming light is converted into a current that is integrated during a sample period. The stored value is periodically read out, so that it is available for a next step in a processing sequence. At the start of an integration cycle, a reset switch 28 is turned "on" to reset an integration capacitor 30 to 3.25 volts. As shown in FIG. 4, the reset switch 28 is a p-channel transistor that is turned "on" by applying a logic low to the gate of the transistor via a first reset line 32. Photocurrent that is generated by means of a photodiode 34 is amplified by a PNP transistor 36. The photodiode and the transistor, along with a parasitic capacitance 38, define a photoelement 40. The amplified photocurrent charges the integration capacitor 30 downwardly toward a level of 1.75 volts. At the end of the sample period, a read switch 42 is turned "on" to output the stored value along a read line 44 to a transfer amplifier 46. As shown in FIG. 4, the read switch is an n-channel transistor that is controlled by a read control line 48.

The photodiode 34 of the photoelement 40 generates a current in response to reception of light photons. The photodiode is connected to the base of the PNP transistor 36. The reverse bias diode capacitance 38 is a parasitic capacitance that may be 0.16 pF. In the embodiment described above in which there is a 32×64 element array, the optical power on the photodiode was determined to be 1.1 nW. This causes a current of 0.6 nA in the diode current source. Because of the low current level, amplification is needed to ensure that the optical variation signal, which is only approximately six percent of the constant photocurrent, will create sufficient voltage differences to be distinguished from noise.

The PNP transistor 36 of the photoelement 40 amplifies the photocurrent. The amplification provided by the transistor allows use of an integration capacitor 30 that facilitates reproducibility from photoelement to photoelement. In the absence of amplification, the low current from the photodiode 34 would require a very small capacitor as an integrator in order to get a 2 volt swing, e.g. 10 fF. Because of the parasitics, this would be difficult to reproduce on an element-to-element basis. Changing the photoelement layout from a diode to a substrate PNP device is a convenient way of providing current amplification. A beta value of eighteen increases the output emitter current to 11.4 nA. Thus, an integration capacitor of 0.20 pF can be used. This facilitates reproducibility, but is not so large as to require excessive area.

A concern with the circuit of FIG. 3 is that a direct beta dependency is introduced into the output current determination and, therefore, the integration capacitor voltage. However, testing has shown that matching of the devices from unit to unit is good, so that the effects of the beta dependency should be minor.

A servo circuit is formed by three MOS transistors 50, 52 and 54. The three MOS transistors form a bias point amplifier with a common gate stage for the output of the phototransistor 36. To achieve proper transfer of the current generated in the photoelement 40 to the integration capacitor 30, the photodiode reverse voltage (i.e., the transistor base voltage) must be kept at a substantially constant level. If the voltage at the base node 56 were to be allowed to shift, the photocurrent would be at least partially consumed in charging and discharging the diode capacitance 38, rather than providing current to be amplified by the substrate PNP transistor 36.

The transistor base voltage at the node 56 is kept at a substantially fixed level by the three MOS transistors 50, 52 and 54. While not critical to achieving the desired operation, in the embodiment of FIGS. 3 and 4, the substantially fixed voltage level is approximately equal to the NMOS threshold level above AVSS at the collector node 58. The three MOS transistors operate as a negative feedback loop by means of transistor 52 operating as a source follower to the emitter node 62 of the PNP transistor. Thus, the base voltage is controlled by the emitter voltage of the transistor. This is possible because the base voltage, i.e. the photodiode output, has a very high DC impedance level. The bias technique of emitter control operated effectively during testing. From the output perspective, transistor 52 is a common gate stage that has an added advantage of providing additional isolation of the emitter node 62 and the base node 56 of the transistor from the voltage swing of a PHTO1 node 64.

Figure 5:
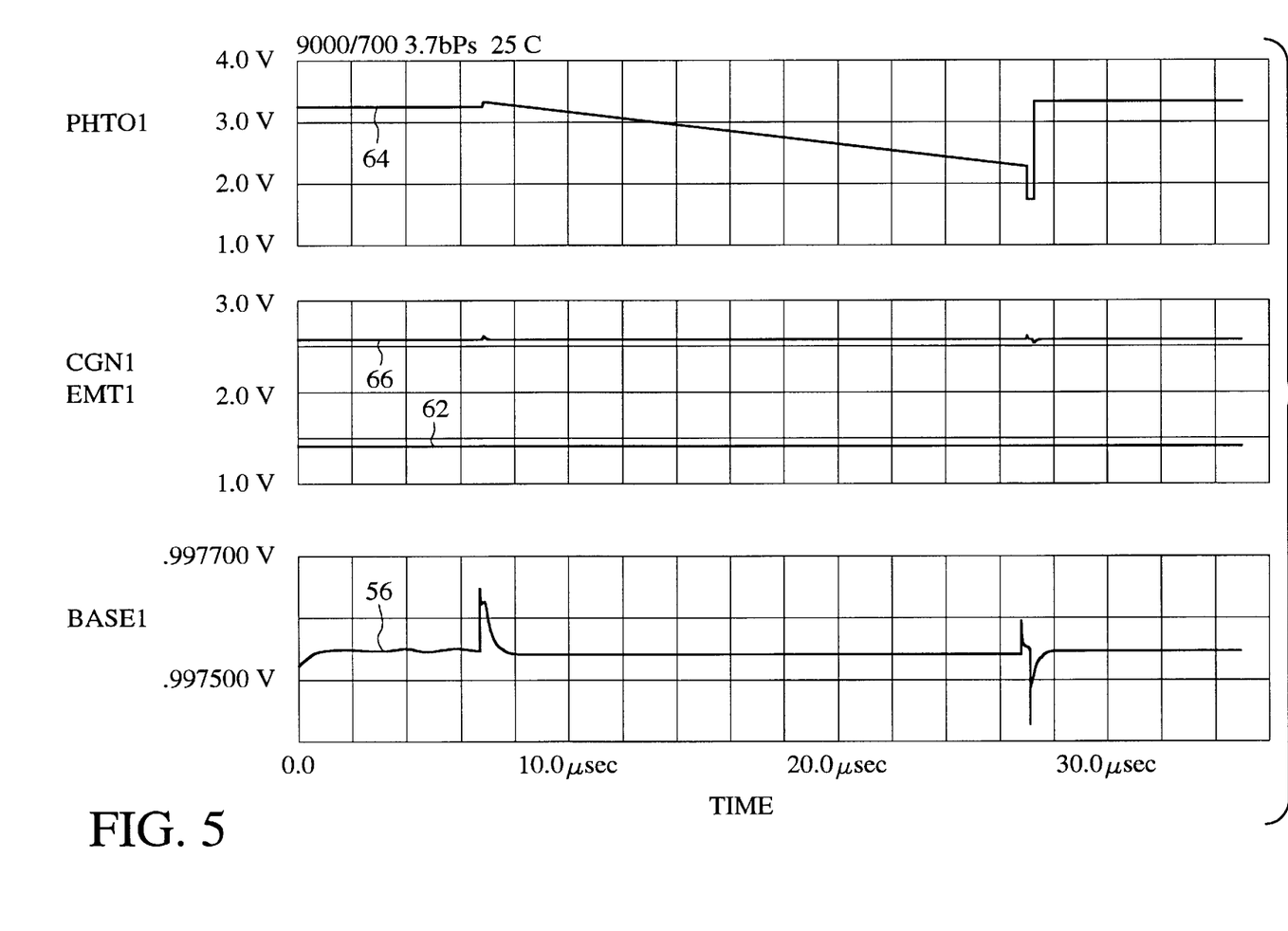
FIG. 5 is a timing diagram for the circuit of FIG. 4.

Referring now to FIGS. 3, 4 and 5, for a period, the output voltage at the PHTO1 node 64 is held at 3.25 volts, i.e. VBB1. The reset switching transistor 28 establishes the 3.25 volts. With the switching transistor electrically "on," the CGN1 node 66 is held at approximately 2.6 volts and the emitter node 62 is held at approximately 1.4 volts. The base voltage at node 56 is near 1.0 volts.

When the light source that illuminates the medium of interest is turned "on," a photocurrent of approximately 0.6 nA is established from the base of the transistor 36 to the collector node 58, which is connected to AVSS. At 7.0 psec from the start of the sequence, the reset signal at the first reset line 32, i.e. RST1B, is caused to go to logic high, thereby turning "off" the reset switch 28. As a result, the output at the PHTO1 node 64 ramps downwardly in a linear manner as the current of the phototransistor 36 emitter is pulled from a capacitive structure formed by the gate-to-channel capacitance of a first n-channel transistor 68 in parallel with a second n-channel transistor 70. The range of voltage of interest is from 3.25 volts to 1.75 volts. Consequently, the gates of the first and second n-channel transistors 68 and 70 are kept sufficiently high that the gate-to-channel capacitance of the devices is above the threshold level of the devices.

During the integration time in which the reset switch 28 is "off," the voltage at the emitter node 62 and the base node 56 remains stabilized by the negative feedback loop described above. The voltage at the base node stays within a range of approximately 2 mv.

After approximately 20 microseconds of integration time, read switch 42 is turned "on" with a positive going gate pulse to transistor 42 by means of the read control line 48. The positive gate pulse lasts for approximately 200 ns. The operation of the transfer amplifier 46 pulls the PHTO1 node 64 down to 1.75 volts. This accomplishes the transfer of the signal to the capacitor 72 in the transfer amplifier. At the conclusion of the transfer process, the read control line 48 is caused to return to a logic low and the first reset line 32 is also caused to go low. This turns the reset switch 28 "on," pulling the PHTO1 node 64 back up to 3.25 volts.

Figure 6:
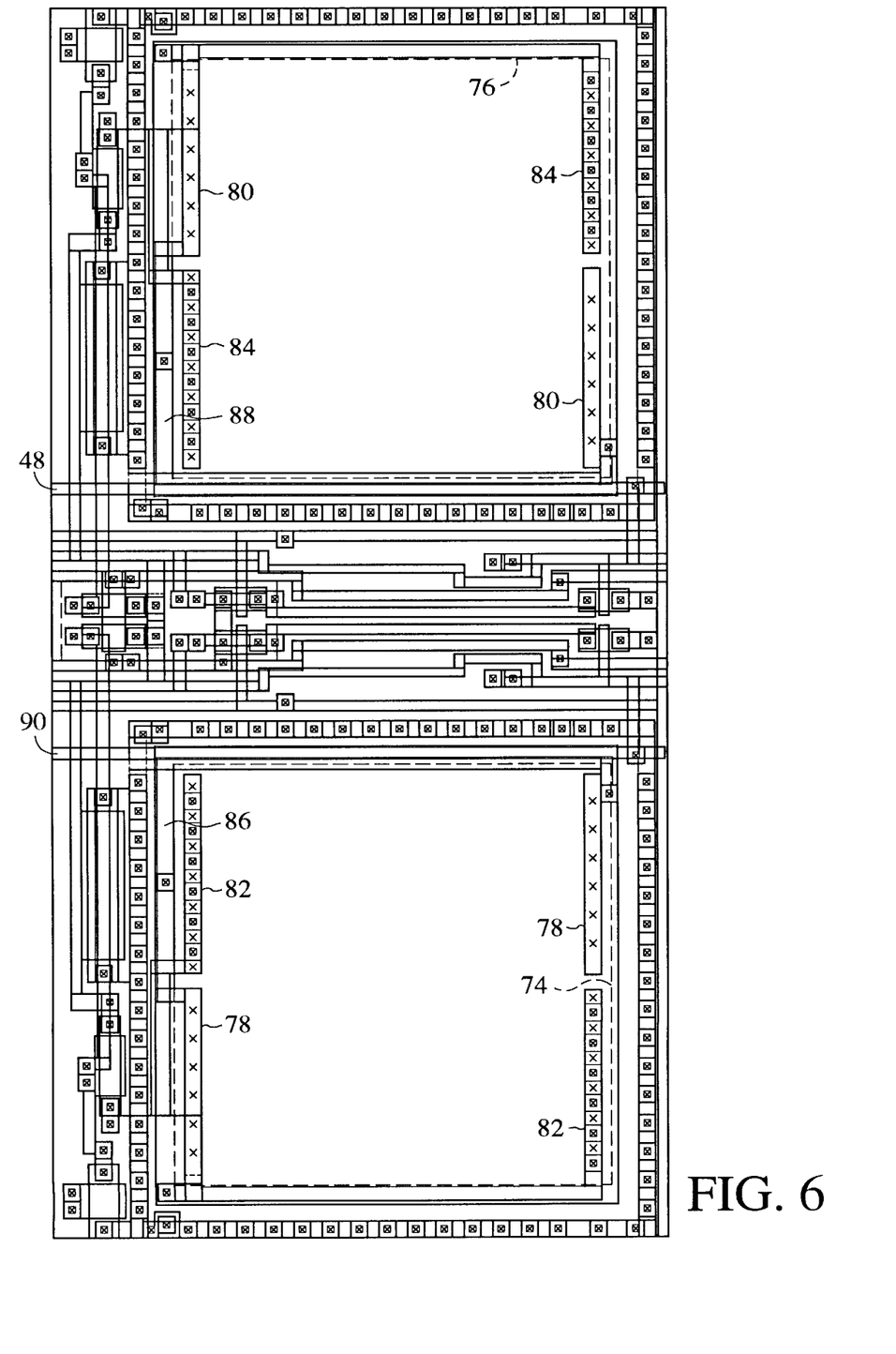
FIG. 6 is a circuit layout for the circuit of FIG. 4.

Referring now to FIGS. 4 and 6, each navigation sensor described above is an array of elements laid out in photoelement pairs. Two units of 60 μm×60 μm are fabricated together so that several common signals can be shared between the two units. This reduces the amount of area needed for interconnection. Consequently, the photoelement light reception area can be increased. For example, the light reception area may be 40 percent of the total area. The use of minimal switching and servo amplifier circuitry provides the high "fill factor" relative to prior art photodiode analog processing combination approaches.

In FIG. 6, the photodiode or base region of each phototransistor is formed from an n-well diffusion into a p substrate. The n-well region is bounded by dashed lines 74 and 76 in the plot of FIG. 6. The combination of the relatively lightly doped n-well region over a p epitaxial layer provides desired photoresponse characteristics. At a wavelength of 650 nm, the quantum efficiency was approximately 87.8 percent. An objective of the layout is to maximize the n-well relative to the total area, so that a high percentage of the light shining on the total area is converted to photocurrent.

Two types of contacts to the n-well regions identified by the dashed lines 74 and 76 are used. The n-island strips 78 and 80 make contact with the n-well region of each photoelement to form cathodes of the photodiodes. These are also the base contacts for the substrate PNP transistors. The n-well-to-substrate junction of each photoelement forms the base-to-collector junction of the phototransistor. Alternating with these contacts are the p-island strips 82 and 84. The p strips define the emitter contacts for the phototransistors, creating junctions with the n-well regions identified by the dashed lines 74 and 76. For each of the two photoelements, a base metal line 86 and 88 extends to a read control line 48 and 90, which are schematically shown in FIG. 4.

Only the portions of the n-well regions 74 and 76 that do not include contacts should be exposed to light. Moreover, the other circuitry of FIG. 6 should not be exposed to light. Therefore, a layer of metal may be used to provide the necessary light shielding of areas that are not to be exposed.

Figure 7:
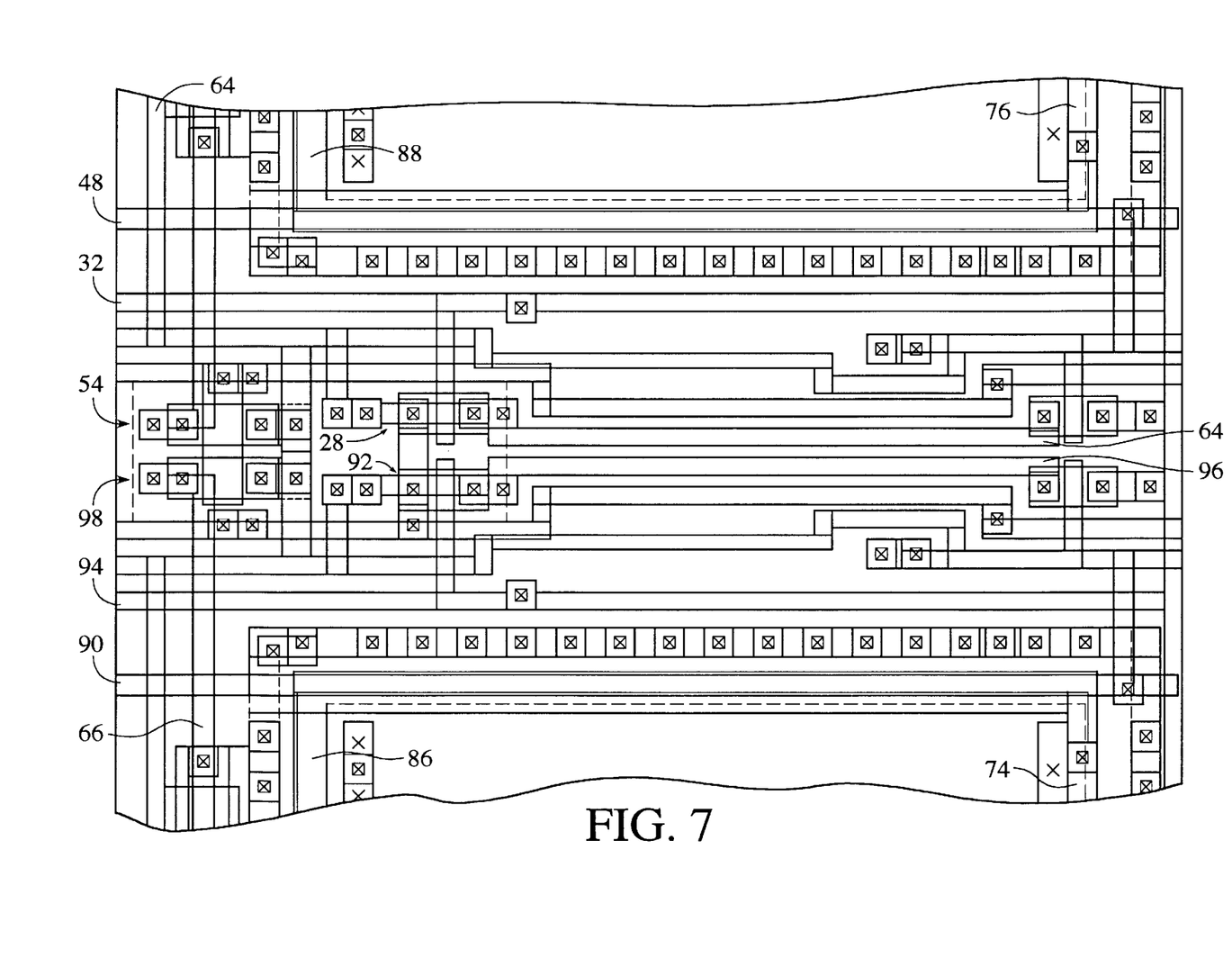
FIG. 7 is an enlargement of a portion of the circuit of FIG. 6.

FIG. 7 is an enlarged drawing of the portion of the circuitry of FIG. 4 found between the pair of light-receiving areas of FIG. 6. Comparing FIGS. 4 and 7, the region between the two light-receiving areas includes a pair of reset devices 28 and 92 that are each connected to a reset line 32 and 94 and to PHTO1 nodes 64 and 96. The center region also includes the MOS transistors 54 and 92 that provide the high impedance condition and constant current source required to operate each of the negative feedback loops, as described above. In fact, only the gain transistors 50 and 100, the common gate stage and one of the transistors 68 and 70 that define the storage capacitance can be found outside of the center region (in FIG. 4, the storage-capacitive transistors for the second photoelement 102 are identified by reference numerals 104 and 106).

In many applications using CMOS switches, there is a requirement for charge injection compensation devices in combination with the switching requirements for the circuit of FIGS. 4 and 6. The concern is that the switching activity will be coupled through and will cause small step errors. Charge injection compensation circuitry is conventionally used to prevent such errors. However, the additional circuitry has an area penalty. In the present application, the area penalty will reduce the percentage of light-receiving area to total area. By providing photoelement pairs and fabricating the circuitry in the manner shown in FIGS. 6 and 7, charge compensation devices may be eliminated. Since the operation of the circuitry depends upon the differential nature of the signal outputs, the comparison of adjacent units to look for differences should provide first order subtraction of charge injection effects.

Another factor in increasing the percentage of light-receiving area is the use of a single transfer amplifier for an entire column of photoelements. In the embodiment described above, there are thirty-two rows and sixty-four columns of photoelements. Each row is comprised of sixteen photoelement pairs. At the bottom of each column is a transfer element, such as the transfer element 46 shown in FIG. 3. Readout operates one row at a time, i.e. all of the elements in one row are read out simultaneously with the sixty-four column transfer amplifiers at the bottom of the array. After this is completed and the signals are transferred to downstream processing circuitry, the next row of photoelements is read out. To accommodate the operation, the timing of the integration and readout is staggered by a 300 ns read-and-restart time from one row to the next row.

The transfer operation to subsequent processing circuitry is not critical to the invention. Nevertheless, an overview of the transfer amplifier 46 of FIG. 3 is provided. Between transfers by the transfer amplifier 46, the unit is reset, with the integration capacitor 30 shorted out. During this time, the input node is held at 1.75 volts. Before a reset operation, the reset switch is opened. Then, the read switch 42 from a selected photoelement is turned "on." This causes a positive perturbation in the voltage of the input of the transfer amplifier 46 connected to the read line 44 (i.e., the minus input of the amplifier). At the output line 108 of the transfer amplifier, the output will go negative, pulling charge through the transfer capacitor from the read line. This brings the voltage level to 1.75 volts. Since charge is conserved, the amount of charge required to bring the integration capacitor 30 down from its final voltage to the fixed potential (e.g., 1.75 volts) of the fixed input of the transfer amplifier is pulled from the integration capacitor onto the transfer capacitor.

We claim:

1. A circuit for generating an electrical signal responsive to reception of light energy comprising:

a photoelement having an amplification transistor and a photoreceptor, said photoelement having an emitter node and a base node, said photoreceptor being connected to generate a current at said base node in response to reception of light energy; and servo means for dynamically stabilizing a voltage at said base node during reception of light energy by said photoreceptor, said servo means including a feedback loop connected to bias said base node via said emitter node, said feedback loop including first and second MOS transistors, said first MOS transistor having a gate connected to said base node and having a drain, said second MOS transistor having a gate connected to said drain of said first MOS transistor and having a source connected to said emitter node.

2. The circuit of claim 1 wherein said amplification transistor is a bipolar transistor and said photoreceptor is a photodiode connecting a base of said bipolar transistor to a collector of said bipolar transistor, said feedback loop being a negative feedback loop in which a voltage variation at said base node of said photoelement is translated to an inverse voltage variation at said emitter node.

3. The circuit of claim 2 further comprising an integration capacitor connected with respect to said photodiode and bipolar transistor such that said integration capacitor is charged upon reception of light energy at said photodiode.

4. The circuit of claim 1 wherein said feedback loop includes a third MOS transistor connected to said drain of said first MOS transistor to provide a current source.

5. The circuit of claim 1 further comprising a capacitor connected to said photoelement to be charged in response to electrical current induced upon reception of light energy by said photoreceptor, said capacitor being connected to a read line for selectively determining charge at said capacitor.

6. The circuit of claim 1 wherein said photoelement is one element in an array of photoelements.

7. A photoelement circuit comprising:

a bipolar transistor having a base, an emitter and a collector;

a photoreceptor connected to said base induce current in response to detection of light;

a negative feedback loop having a first MOS transistor having a gate connected to said base and having a drain, said negative feedback loop having a second MOS transistor having a gate connected to said drain of said first MOS transistor and having a source connected to said emitter of said bipolar transistor; and a capacitor connected to receive charge in response to current induced by said photoreceptor.

8. The circuit of claim 7 wherein said drain of said first MOS transistor is connected to a supply of a substantially fixed current.

9. The circuit of claim 8 wherein said substantially fixed current is supplied via a third MOS transistor that is biased into a conductive state.

10. The circuit of claim 7 wherein said second MOS transistor has a drain connected to a terminal of said capacitor.

11. The circuit of claim 10 further comprising a reset switching means for selectively applying a reset voltage to said capacitor.

12. The circuit of claim 7 further comprising a read switching means for selectively reading the charge of said capacitor.

* * * * *